United States Patent

Nishio et al.

(10) Patent No.: US 9,013,161 B2
(45) Date of Patent: Apr. 21, 2015

(54) LOAD DRIVE CIRCUIT

(75) Inventors: Minoru Nishio, Nagano (JP); Takatoshi Oe, Nagano (JP); Yoshiaki Toyoda, Nagano (JP)

(73) Assignee: Fuji Electric Co., Ltd., Kawasaki-Shi (JP)

(*) Notice: Subject to any disclaimer, the term of this patent is extended or adjusted under 35 U.S.C. 154(b) by 0 days.

(21) Appl. No.: 14/238,759

(22) PCT Filed: Aug. 21, 2012

(86) PCT No.: PCT/JP2012/071034
§ 371 (c)(1),
(2), (4) Date: May 28, 2014

(87) PCT Pub. No.: WO2013/047005
PCT Pub. Date: Apr. 4, 2013

(65) Prior Publication Data
US 2014/0253078 A1     Sep. 11, 2014

(30) Foreign Application Priority Data
Sep. 29, 2011   (JP) .................................. 2011-214630

(51) Int. Cl.
*H02M 1/32*     (2007.01)
*H03K 17/18*    (2006.01)
*G01R 31/40*    (2014.01)
*H02H 3/24*     (2006.01)

(52) U.S. Cl.
CPC .............. *G01R 31/40* (2013.01); *H02H 3/243* (2013.01); *H02M 1/32* (2013.01); *H03K 17/18* (2013.01); *H03K 2217/0063* (2013.01)

(58) Field of Classification Search
USPC ................................................. 323/271–285
See application file for complete search history.

(56) References Cited

U.S. PATENT DOCUMENTS

| | | | | |
|---|---|---|---|---|
| 4,695,785 A | * | 9/1987 | Mieth et al. .................... | 323/222 |
| 5,585,994 A | * | 12/1996 | Tamai et al. .................... | 361/98 |
| 7,545,127 B2 | * | 6/2009 | Takahashi et al. ............. | 323/276 |
| 2007/0229041 A1 | * | 10/2007 | Oki et al. ...................... | 323/266 |

FOREIGN PATENT DOCUMENTS

| | | |
|---|---|---|
| JP | S62-25509 A | 2/1987 |
| JP | H06-104711 A | 4/1994 |
| JP | 2000-321334 A | 11/2000 |
| JP | 2006-279866 A | 10/2006 |
| JP | 2008-092277 A | 4/2008 |

* cited by examiner

*Primary Examiner* — Jessica Han
(74) *Attorney, Agent, or Firm* — Rabin & Berdo, P.C.

(57) ABSTRACT

An open load and a supply fault are differentiated between and detected with a simple configuration. A switching element (Q1) connected between the positive electrode of a direct current power supply and an output terminal (9) is caused to carry out a switching operation, thereby driving a load (7) connected to the output terminal (9). A load trouble detection circuit (21) that detects an opening of the load (7) or a supply fault when the voltage of the output terminal (9) is higher than the value of a first threshold voltage, and a supply fault detection circuit (25) that detects a failure of supply to the power supply of the load (7) when the voltage of the output terminal (9) is higher than the value of a second threshold value voltage subtracted from the power supply voltage when the switching element (Q1) is in an off-state, are included.

7 Claims, 4 Drawing Sheets

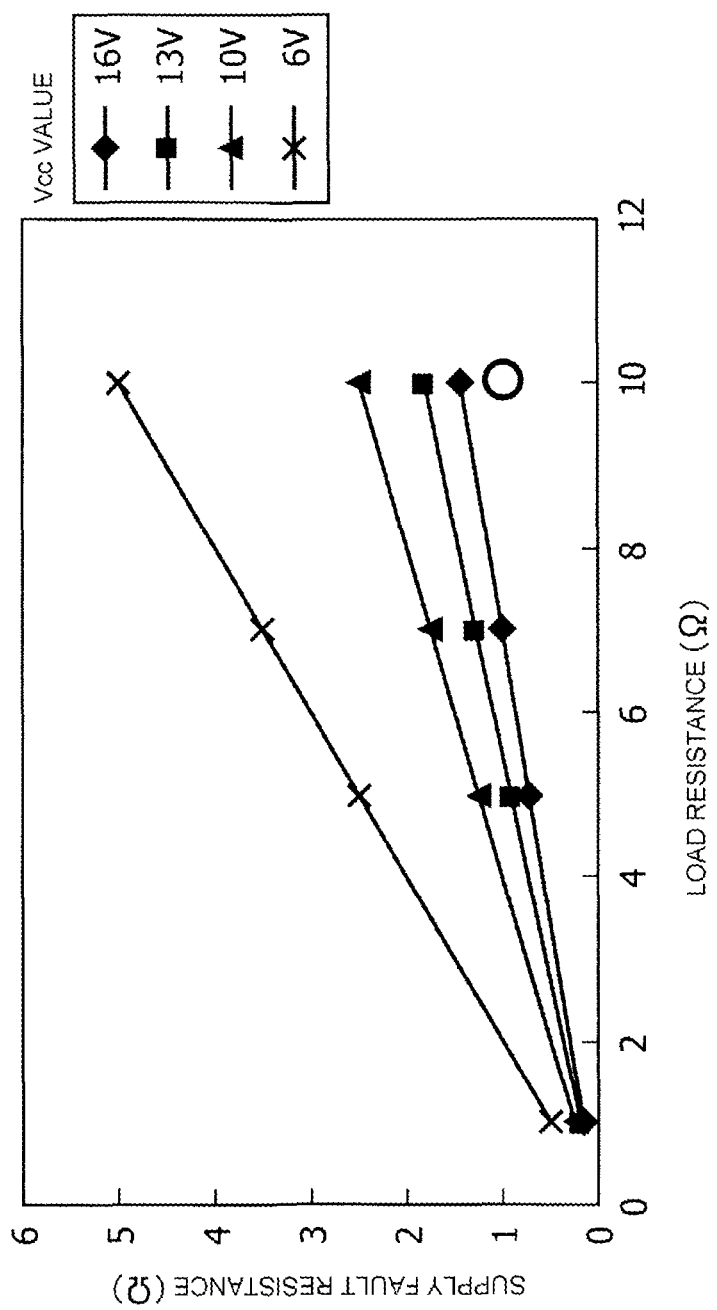

LOAD DRIVE CIRCUIT

TECHNICAL FIELD

The present invention relates to a load drive circuit having a configuration wherein a switching element is interposed between the positive electrode of a power supply and a load, and in particular, relates to a load drive circuit having a function of detecting an open load and a supply fault.

BACKGROUND ART

In a load drive circuit of a so-called high-side configuration, wherein a switching element is interposed between the positive electrode of a power supply and a load, there is concern that an open load (a condition wherein the load is electrically cut off due to a disconnection, or the like, or there is a state of high but finite resistance between an output terminal and the load) or a supply fault (a condition wherein the positive electrode of the power supply and the load are short circuited, or there is an extremely low resistance value) will occur. Therefore, PTL 1 proposes a load drive circuit of a high-side configuration having a function of distinguishing between and detecting the open load and supply fault.

CITATION LIST

Patent Literature

PTL 1: JP-A-2008-92277

SUMMARY OF INVENTION

Technical Problem

The load drive circuit according to PTL 1 is such that it is necessary to provide a large number of reference power supply circuits in order to distinguish between an open load and a supply fault, because of which there is a problem in that the configuration becomes complex and increases in size. Also, a circuit of FIG. 3 of PTL 1 that detects a supply fault determines that there is a supply fault in accordance with the potential of an output terminal 3-16, but there is also a problem in that the output (a constant voltage VOUTOPEN) of a voltage follower is connected to the output terminal 3-16 when attempting to determine whether there is a supply fault, which impedes the determination.

The invention, bearing in mind this kind of situation, has an object of providing a load drive circuit such that an open load and supply fault can be differentiated between and detected with a simple configuration.

Solution to Problem

The invention provides a load drive circuit that causes a switching element connected between the positive electrode of a direct current power supply and an output terminal to carry out a switching operation, thereby driving a load connected to the output terminal, the load drive circuit including a constant current element connected in parallel with the switching element, a resistor connected between the constant current element and the negative electrode of the direct current power supply, an open load detection circuit that detects an opening of the load when the voltage of the output terminal is higher than the value of a first threshold voltage and lower than the value of a second threshold voltage subtracted from the voltage of the direct current power supply when the switching element is in an off-state, and a supply fault detection circuit that detects a failure of supply to the power supply of the load when the voltage of the output terminal is higher than the value of the second threshold voltage subtracted from the voltage of the direct current power supply when the switching element is in an off-state.

The supply fault detection circuit includes a Pch-MOSFET having the second threshold voltage, and can be configured so as to detect the supply fault in response to the Pch-MOSFET being turned on.

The load drive circuit may include an oscillator that generates a pulse signal of a predetermined frequency as a signal indicating a supply fault condition when the supply fault detection circuit detects a supply fault.

The voltage of the output terminal accompanying a failure of supply to the load is regulated by, for example, the voltage value of the power supply being divided by the resistance value of the supply fault and the resistance value of the load.

The voltage of the output terminal accompanying an opening of the load is regulated by, for example, the current of the constant current element flowing through a parallel resistor formed of the resistor and a series resistor of a resistor between the output terminal and load and the load.

The open load detection circuit includes an Nch-MOSFET having the first threshold voltage, and can be configured so as to detect that the voltage of the output terminal is higher than the value of the first threshold voltage in response to the Nch-MOSFET being turned on.

Advantageous Effects of Invention

According to the invention, it is possible to differentiate between an open load and supply fault with a simple configuration, without providing a large number of reference power supply circuits, because of which it is possible to achieve an improvement in reliability, a reduction in cost, and a reduction in size.

BRIEF DESCRIPTION OF DRAWINGS

FIG. 4 is a graph showing a relationship between a load resistance and supply fault resistance such that detection of a supply fault is possible.

DESCRIPTION OF EMBODIMENTS

Figure 1:
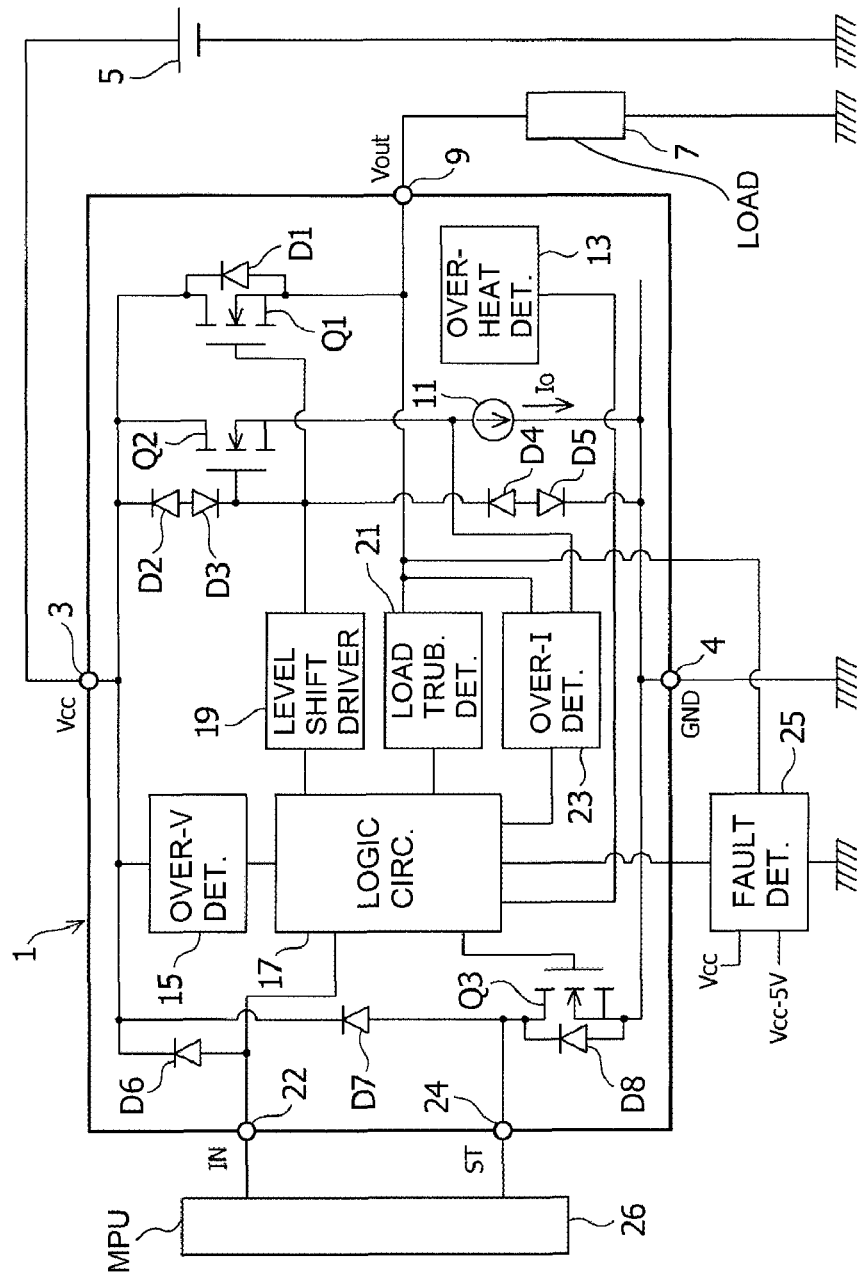
FIG. 1 is a circuit block diagram showing an embodiment of a load drive circuit according to the invention.

FIG. 1 shows a load drive circuit 1 according to an embodiment of the invention. In the load drive circuit 1, the positive electrode of a direct current power supply 5 is connected to a power supply terminal 3, and one end of a load 7 is connected to an output terminal 9. The negative electrode of the direct current power supply 5, the other end of the load 7, and a ground terminal 4 are all grounded.

A switching element Q1 formed of an Nch-MOSFET (Metal-Oxide-Semiconductor Field-Effect Transistor) is interposed between the power supply terminal 3 and output terminal 9, and a switching element Q2, formed of an Nch-MOSFET, and a constant current element 11 are connected in series between the power supply terminal 3 and ground terminal 4.

As heretofore described, the load drive circuit 1 according to the embodiment is a load drive circuit of a so-called high-side configuration, wherein the switching element Q1 is interposed between the positive electrode of the direct current power supply 5 and the load 7.

An overheat detection circuit 13 detects an overheat of the switching element Q1, and outputs the result of the detection to a logic circuit 17. The overheat detection circuit 13 can be configured so as to detect an overheat utilizing, for example, the forward voltage temperature dependence of a diode.

An overvoltage detection circuit 15 detects that an output voltage Vcc of the direct current power supply 5 has become excessive, and outputs the result of the detection to the logic circuit 17. A level shift driver 19 shifts the level of an on/off signal output from the logic circuit 17, and outputs the level shifted signal to the gate terminals of the switching elements Q1 and Q2.

A load trouble detection circuit 21 detects an open load (a condition wherein the load 7 is electrically cut off due to a disconnection, or the like, or there is a state of high but finite resistance between the output terminal 9 and load 7) or a supply fault (a condition wherein the positive electrode of the direct current power supply 5 and the load are short circuited, or there is an extremely low resistance value), an overcurrent detection circuit 23 detects that an overcurrent is flowing through the switching element Q1, a supply fault detection circuit 25 detects a supply fault, and each of these outputs the result of the detection to the logic circuit 17. The load trouble detection circuit 21 and supply fault detection circuit 25 configure an open load detection circuit, and when the output of the load trouble detection circuit 21 indicates trouble with the load while the output of the supply fault detection circuit 25 does not indicate a supply fault, the logic circuit 17 determines that the open load detection circuit has detected an open load. The configuration and operation of the load trouble detection circuit 21, overcurrent detection circuit 23, and supply fault detection circuit 25 will be described hereafter. In FIG. 1, the supply fault detection circuit 25 is shown on the exterior of the load drive circuit 1, but the supply fault circuit 25 may be provided as an internal circuit of the load drive circuit 1, or may be provided as an external circuit. When the load drive circuit 1 is configured on a semiconductor chip, it is preferable that the supply fault detection circuit 25 is an internal circuit.

An input terminal 22 is connected to the logic circuit 17. A status output terminal 24 is connected to the drain terminal of a switching element Q3 operated by a status determination signal output from the logic circuit 17. Further, a micro computer (hereafter abbreviated to MC) 26 is connected to the input terminal 22 and status output terminal 24.

The load drive circuit 1 according to the embodiment includes an unshown internal power supply circuit. The internal power supply circuit forms a predetermined voltage (for example, 5V, Vcc−5V, or the like) using the output voltage Vcc of the direct current power supply 5, and supplies the voltage as a high potential side voltage or low potential side voltage of the power source of each of the detector circuits 13, 15, 21, 23, and 25, the logic circuit 17, and the level shift driver 19. The supplied voltage is used to keep the signals (the amplitude thereof) output from the circuits at a 5V level.

Diodes D1 and D8 are parasitic diodes of the switching element Q1 and a switching element Q3 respectively. Diodes D2, D3, D4, and D5 are provided in order to protect the gates of the switching elements Q1 and Q2. Also, a diode D6 is provided in order to protect the logic circuit 17, and a diode D7 is provided in order to protect the switching element Q3.

Next, a description will be given of the load trouble detection circuit 21, overcurrent detection circuit 23, and supply fault detection circuit 25.

Figure 2:
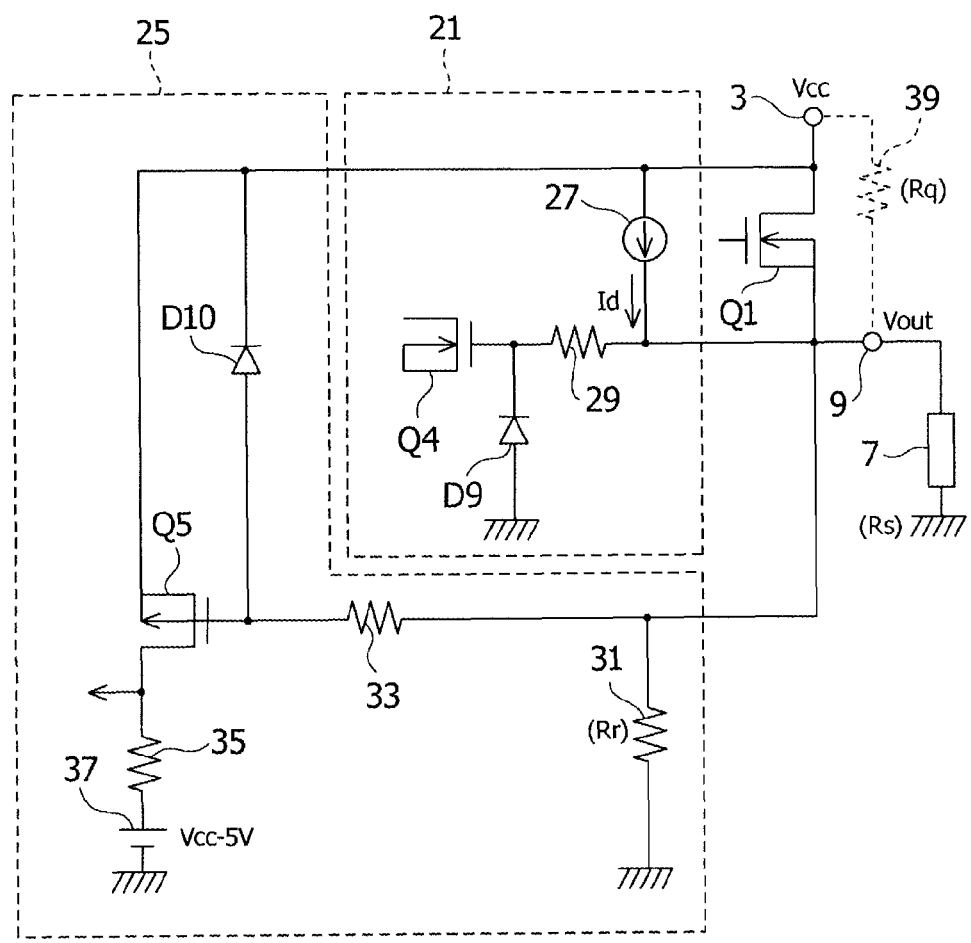
FIG. 2 is a circuit diagram showing a configuration example for an open load detection circuit and a supply fault detection circuit.

The load trouble detection circuit 21, as shown in FIG. 2, includes a switch element Q4 formed of an Nch-MOSFET, a constant current element 27 connected between the power supply terminal 3 and output terminal 9, a resistor 29 connected between the gate terminal of the switch element Q4 and the output terminal 9, and a protective diode D9 connected between the gate terminal and a grounding point. Also, the overcurrent detection circuit 23 incorporates a comparator that compares the voltage of the output terminal 9 and the voltage at a series connection point of the switching element Q2 and constant current element 11 shown in FIG. 1, and compares the source voltages of the switching elements Q1 and Q2 when the two are in an on-state. That is, as will be described hereafter, the gate voltages of the two are the same, so the gate-to-source voltages of the two are compared, by doing which the currents flowing through the switching elements Q1 and Q2 are indirectly compared, and it is determined whether there is an overcurrent.

The supply fault detection circuit 25, as shown in FIG. 2, includes a switch element Q5 formed of a Pch-MOSFET, a resistor 31 connected between the output terminal 9 and a grounding point, and a protective resistor 33 connected between the output terminal 9 and the gate terminal of the switch element Q5. The switch element Q5 is such that the source terminal is connected to the power supply terminal 3, while the drain terminal is grounded via a resistor 35 and a voltage supply 37. The voltage supply 37 is provided by the heretofore described internal power supply circuit, and outputs voltage (Vcc−5V). Also, a diode D10 is provided in order to protect the gate of the switch element Q5.

Hereafter, a description will be given, while referring to the contents of the table below, of operations of the load drive circuit 1 according to the embodiment.

TABLE 1

|  | Input Terminal (22) | Status Output Terminal (24) | Output Terminal (9) | Remarks |
|---|---|---|---|---|
| Normal operation | L<br>H | L<br>H | L<br>H |  |
| Open load detection | L | H | H | Self-reset |
| Supply fault detection | L | Oscillation | H | Self-reset |
| Overcurrent detection | L<br>H | L<br>L | L<br>L | Current oscillation mode Self-reset |
| Overheat detection | L<br>H | L<br>L | L<br>L | Self-reset |
| Overvoltage detection | L<br>H | L<br>H | L<br>L | Self-reset |

When the input terminal 22 is at an L level under normal conditions, the switching element Q3 is turned on by the logic circuit 17, and the status output terminal 24 is at an L (Low) level. Also, as the level shift driver 19 outputs a gate signal commanding a turning off, the switching elements Q1 and Q2 are turned off, as a result of which the output terminal 9 is changed to an L level via the load 7. That is, as the resistance value of the load 7 is normally a low resistance value of the order of 10Ω, the potential of the output terminal 9 is pulled down by the load 7.

Meanwhile, when the input terminal 22 changes to an H (High) level under normal conditions, the switching element Q3 is turned off by the logic circuit 17, and the status output terminal 24 changes to an H level. Also, as the level shift driver 19 outputs a gate signal commanding a turning on, the switching elements Q1 and Q2 are turned on, as a result of which the output terminal 9 changes to an H level, and current flows through the load 7.

The detection of an open load is carried out when the input terminal 22 is in an L level condition, that is, when the switching element Q1 is in an off-state. An open load condition not only refers to a condition wherein the output terminal and load are completely cut off, but also includes a condition wherein there is a high but finite resistance.

In FIG. 2, when there is an open load, an open load resistor (a resistor of the open load 7 side seen from the output terminal 9) and the resistor 31 are connected in parallel between the output terminal 9 and a grounding point, and a constant current from the constant current element 27 flows through this parallel combined resistor. Consequently, when taking the value of the constant current to be Id and the value of the parallel combined resistor to be Rp, a voltage of Vout=Id·Rp is generated in the output terminal 9.

In the embodiment, taking into consideration the minimum value of the open load resistor envisaged when there is an open load, the constant current Id and a value Rr of the resistor 31 are set so that the voltage Id×Rp with respect to a threshold voltage Vth(n) of the switching element Q1 is such that Id×Rp>Vth(n), because of which the switch element Q4 is turned on in response to the load opening. The logic circuit 17 turns off the switching element Q3 in response to the switch element Q4 being turned on, as a result of which the status output terminal 24 changes to an H level.

Therefore, the MC 26 determines that there is a load trouble based on the abnormality of the status output terminal 24 changing to an H level when the input terminal 22 is at an L level.

Herein, the voltage Vout=Id·Rp is set so that a difference Vcc−Id×Rp with the power supply voltage Vcc does not drop to or below a threshold voltage Vth(p) of the switch element Q5, formed of a Pch-MOSFET, of the supply fault detection circuit 25, that is, so that the relationship Vcc−Id×Rp>Vth(p) (or transposing, Vcc−Vth(p)>Id×Rp) is satisfied, because of which, a turning on of the switch element Q5 when there is an open load is avoided.

As it is not possible to differentiate between an open load and a supply fault simply by the switch element Q4 being turned on (the switch element Q4 is turned on in each case), detection of an open load is carried out in combination with the output of the supply fault detection circuit 25.

The detection of a supply fault is also carried out when the input terminal 22 is in an L level condition, that is, when the switching element Q1 is in an off-state. A supply fault condition not only refers to a condition wherein there is zero resistance between the output terminal 9 and load 7 and a short circuit occurs, but also includes a condition wherein a short circuit occurs at a low resistance that is not zero.

When there is a supply fault, a voltage Vcc×Rs/(Rs+Rq), wherein the power supply voltage Vcc is divided by a value Rq of a supply fault resistor 39, shown by a dotted line, and a resistance value Rs of the load 7, is generated as the voltage Vout of the output terminal 9 (as Rr>>Rs, the resistance value of the parallel resistance of Rr and Rs is practically Rs, and Rr can be ignored).

In the embodiment, taking into consideration the envisaged maximum value of the value Rq of the supply fault resistor 39 and the minimum value of the resistance value Rs of the load 7, the range of the power supply voltage Vcc is set so that the voltage Vcc−(Vcc×Rs/(Rs+Rq)) with respect to the threshold voltage Vth(p) of the switch element Q5 is such that Vcc×Rq/(Rs+Rq)<Vth(p), because of which the switch element Q5 is turned on when there is a supply fault, and an H level supply fault detection signal is output from the drain terminal of the switch element Q5.

The logic circuit 17 into which the supply fault detection signal is input activates a built-in oscillator, and causes the switching element Q3 to be turned on and off in accordance with a clock pulse of a predetermined frequency output from the oscillator. As a result of this, a pulse signal of the predetermined frequency is output from the status output terminal 24. Therefore, the MC 26 determines that there is a supply fault based on the pulse signal.

Also, when the switch element Q4 is turned on and a load trouble is detected, the logic circuit 17 determines that the open load detection circuit has detected an open load unless a supply fault detection signal is output from the supply fault detection circuit 25.

Next, a description will be given of an overcurrent detection. The current flowing through the load 7 is the same as the current flowing through the switching element Q1 shown in FIG. 1. The current in the saturation region of the Nch-MOSFET configuring the switching element Q1 (the load drive circuit 1 is normally designed so that the Nch-MOSFET operates in the saturation region) is practically regulated by the gate-to-source voltage thereof (the current value is a monotonic increasing function with respect to the gate-to-source voltage). When there is a condition wherein an overcurrent flows through the load 7 and switching element Q1, the gate-to-source voltage of the MOSFET configuring the switching element Q1 is high.

Meanwhile, the gate-to-source voltage of the Nch-MOSFET configuring the switching element Q2 is a constant voltage value fixed in accordance with the current value of the constant current element 11. As the gate voltages of the switching elements Q1 and Q2 are equal, the gate-to-source voltages of the two can be compared using the source voltages of the two.

The overcurrent detection circuit 23 includes an operational amplifier that amplifies the difference between the source voltages of the switching elements Q1 and Q2, and causes a logic level overcurrent detection signal to be output from the operational amplifier. That is, when the source voltage of the switching element Q1 is lower, the gate-to-source voltage of the switching element Q1 is higher than that of the switching element Q2 and, taking the size ratio expressing (size of switching element Q1/size of switching element Q2) to be n and the value of the constant current flowing through the constant current element 11 to be Io, the overcurrent detection circuit 23 can determine that the current flowing through the switching element Q1 is greater than nIo, that is, that there is an overcurrent condition, and outputs an overcurrent detection signal. Therefore, the logic circuit 17 turns on the switching element Q3 in response to the overcurrent detection signal, as a result of which the status output terminal 24 changes to an L level. Also, the logic circuit 17 turns off the switching elements Q1 and Q2 in response to the overcurrent detection signal, as a result of which the output terminal 9 changes to an L level.

Meanwhile, when the overheat detection circuit 13 detects an overheat of the switching element Q1 too, the switching element Q3 is turned on, the status output terminal 24 changes to an L level, the switching elements Q1 and Q2 are turned off, and the output terminal 9 changes to an L level.

Therefore, the MC 26 determines that there is an overcurrent or overheat based on the abnormality of the status output terminal 24 changing to an L level when the input terminal 22 is at an H level.

It is also possible for the status output terminal 24 to be at an L level when the overvoltage detection circuit 15 detects an overvoltage. In the embodiment, however, when an overvoltage is detected, the switching element Q3 is turned off, and the status output terminal 24 is changed to an H level. When an overvoltage is detected too, the switching elements Q1 and Q2 are turned off, and the output terminal 9 is changed to an L level, in the same way as heretofore described.

In this case, the MC 26 determines that there is an overvoltage based on the H level of the status output terminal 24 and the L level of the output terminal 9. Consequently, an overvoltage is determined independently.

Figure 3:
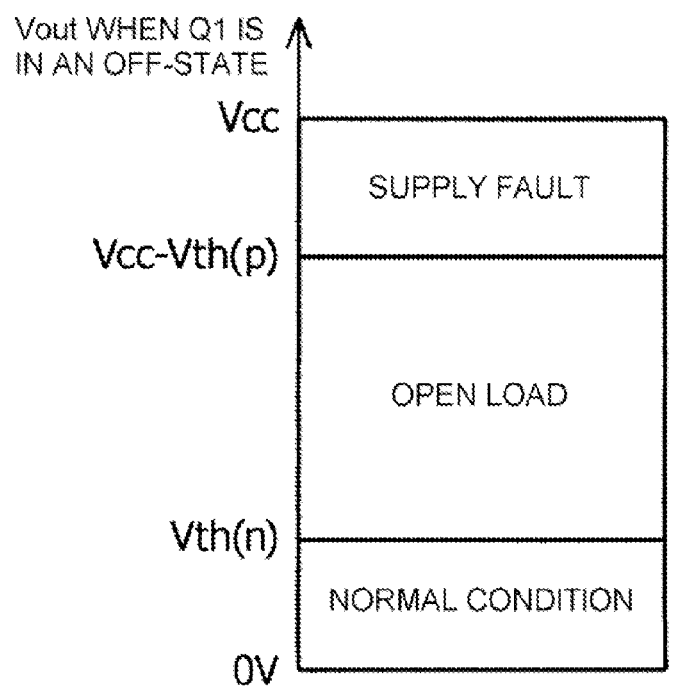
FIG. 3 is an illustration of an operation of the load drive circuit of FIG. 1.

FIG. 3 is a schematization of the above determination operations. As shown in FIG. 3, when the voltage Vout of the output terminal 9 is equal to or lower than the threshold voltage Vth(n) of the switch element Q4 in a condition in which the switching element Q1 is in an off-state, it is determined that conditions are normal. Further, a load trouble, which is an open load or supply fault, is detected from the voltage Vout becoming higher than the threshold voltage Vth(n) of the switch element Q4, and furthermore, a supply fault is detected when the voltage Vout becomes higher than the value of the switch element Q5 threshold voltage Vth(p) subtracted from the power supply voltage Vcc, and an open load is detected when the voltage Vout does not become so high.

The entry "Self-reset" in the table above means that there is an automatic resetting to normal operation, without carrying out any particular electrical resetting operation, when normalizing after the cause of a detected trouble has been eliminated. Also, the entry "Current oscillation mode" in the table above means that, in order to suppress loss between an overcurrent detection and resetting to normal operation, the current flowing through the load 7 is formed into an oscillating waveform and caused to wait by repeatedly turning the switching element Q1 on, then turning it off when the current thereof reaches a predetermined value.

However, as previously described, an open load condition not only refers to a condition wherein the output terminal and load are completely cut off, but also includes a condition wherein there is a high but finite resistance. Assuming that the high but finite resistance is, for example, several kiloohms or higher, it is preferable that the resistance value Rr of the resistor 31 in FIG. 2 is set to 10 kΩ or higher in order to properly detect an open condition, and more preferable still that the resistance value Rr is set to 100 kΩ or higher.

Hereafter, a description will be given of a specific working example.

Vcc=13V
Id=100 μA
Rr=100 kΩ
Vth(p)=2V
Vth(n)=2V
Rs=10 kΩ

[When the output terminal and load are completely cut off]

$$Vout = Id \times R1$$
$$= 100 \ \mu A \times 100 \ k\Omega$$
$$= 10 \ V, \text{ wherein a load trouble is detected when } 10 \ V > Vth(n).$$

A supply fault is not detected but an open load is detected when
13V−10V>Vth(p).

[When there is a supply fault (supply fault resistance value Rq=1Ω]

$$Vout \approx Vcc \times Rs / (Rs + Rq)$$
$$= 13 \ V \times 10 \ \Omega / (10 \ \Omega + 1 \ \Omega)$$
$$= 11.82 \ V$$

$$Vcc - Vout = 13 \ V - 11.82 \ V,$$
$$= 1.18 \ V < Vth(p), \text{ whereby a supply fault is detected.}$$

FIG. 4 shows an example of a relationship between the load resistance and supply fault resistance such that detection of a supply fault is possible, with the power supply voltage Vcc as a parameter, wherein detection of a supply fault is possible when the load resistance and supply fault resistance have values in a region below the characteristic lines. The circle in the drawing indicates the supply fault resistance value (Rq=1Ω) and load resistance value (Rs=10Ω) in the heretofore described working example.

As the load drive circuit according to the embodiment is such that an open load and supply fault can be reliably differentiated between using a simple configuration, as heretofore described, it is possible to achieve an improvement in reliability, a reduction in cost, and a reduction in size.

REFERENCE SIGNS LIST

1 Load drive circuit
2 Power supply terminal
3 Direct current power supply
7 Load
9 Output terminal
11 Constant current element
13 Overheat detection circuit
15 Overvoltage detection circuit
17 Logic circuit
19 Level shift driver
21 Load trouble detection circuit
22 Input terminal
23 Overcurrent detection circuit
24 Status output terminal
25 Supply fault detection circuit
26 Micro computer
27 Constant current element
29, 31, 33, 35 Resistor
37 Voltage supply
Q1, Q2, Q3, Q4 Nch-MOSFET
Q5 Pch-MOSFET

The invention claimed is:
1. A load drive circuit for use with a power supply to drive a load connected to an output terminal of the load drive circuit, the load drive circuit comprising:
   a switching element, connected between a positive electrode of the DC power supply and the output terminal, for carrying out a switching operation and thereby driving the load;
   a constant current circuit connected in parallel with the switching element;
   a resistor connected between the constant current circuit and a negative electrode of the DC power supply;
   an open load detection circuit that detects that the load is open if the voltage at the output terminal is higher than of a first threshold voltage and lower than the value of a second threshold voltage subtracted from the voltage of the DC power supply when the switching element is in an off-state; and a supply fault detection circuit that detects a failure of the DC power supply to supply power to the load if the voltage at the output terminal is higher than the value of the second threshold voltage subtracted from the voltage of the DC power supply when the switching element is in an off-state.

2. The load drive circuit according to claim 1, wherein the supply fault detection circuit includes a Pch-MOSFET having the second threshold voltage, the Pch-MOSFET being configured so as to detect a supply fault in response to the Pch-MOSFET being turned on.

3. The load drive circuit according to claim 1, further comprising an oscillator that generates a pulse signal with a predetermined frequency as a signal indicating a supply fault condition when the supply fault detection circuit detects a supply fault.

4. The load drive circuit according to claim 1, wherein the voltage at the output terminal accompanying a supply fault is regulated by the voltage value of the DC power supply being divided by the resistance value of the supply fault and the resistance value of the load.

5. The load drive circuit according to claim 1, wherein the voltage at the output terminal accompanying an opening of the load is regulated by the current of the constant current circuit flowing through a parallel resistor formed of the resistor and a series resistor of a resistor between the output terminal and the load and the load.

6. The load drive circuit according to claim 5, wherein the open load detection circuit includes an Nch-MOSFET having the first threshold voltage, the Nch-MOSFET being configured so as to detect that the voltage at the output terminal is higher than the first threshold voltage in response to the Nch-MOSFET being turned on.

7. The load drive circuit according to claim 1, wherein the open load detection circuit includes an Nch-MOSFET having the first threshold voltage, the Nch-MOSFET being configured so as to detect that the voltage at the output terminal is higher than the first threshold voltage in response to the Nch-MOSFET being turned on.

* * * * *